(12) United States Patent
Zarrinkoub et al.

(10) Patent No.: US 7,353,146 B2
(45) Date of Patent: Apr. 1, 2008

(54) BLOCK PROCESSING OF INPUT DATA IN GRAPHICAL PROGRAMMING ENVIRONMENTS

(75) Inventors: Houman Zarrinkoub, Framingham, MA (US); Donald P. Orofino, II, Sudbury, MA (US); Navan Ruthramoorthy, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 731 days.

(21) Appl. No.: 10/744,654

(22) Filed: Dec. 22, 2003

(65) Prior Publication Data

US 2005/0138045 A1 Jun. 23, 2005

(51) Int. Cl.
*G06F 7/60* (2006.01)
(52) U.S. Cl. ............................................. 703/2
(58) Field of Classification Search ............... 703/2
See application file for complete search history.

(56) References Cited

U.S. PATENT DOCUMENTS 4,445,176 A * 4/1984 Burk et al. .................. 709/231
4,490,782 A * 12/1984 Dixon et al. ................ 711/136
5,367,385 A * 11/1994 Yuan ........................... 358/465
6,057,861 A * 5/2000 Lee et al. .................... 345/569
6,058,409 A * 5/2000 Kozaki et al. ............... 708/409

OTHER PUBLICATIONS

Astrom et al., "Evolution of Continuous-Time Modeling and Simulation", The 12th European Simulation Multiconference, Jun. 16-19, 1998, Manchester, UK.*
"Dynamic System Simulation for MATLAB" Using Simulink, Version 4, Copyright 1900-2000 by The MathWorks, Inc., pp. 4-28 to 4-61.*

* cited by examiner

*Primary Examiner*—Ngoc-Yen Vu
*Assistant Examiner*—James A Meyers
(74) *Attorney, Agent, or Firm*—Lahive & Cockfield, LLP

(57) ABSTRACT

Methods and systems for performing block processing of input data in graphical programming environments are disclosed. The input data that is to be processed is partitioned into a plurality of blocks. Each block of the input data is applied to the data processing unit for processing each block of the input data. The blocks of the processed data are combined to generate output data. If the size of the output data is smaller than or equals to the size of the input data, the present invention may perform in-place block processing of the input data in which the output data is overwritten on the input data. In the in-place processing of the input data, the output data may share memory space with the input data so that the block processing saves memory space in processing the input data.

42 Claims, 12 Drawing Sheets

BLOCK PROCESSING OF INPUT DATA IN GRAPHICAL PROGRAMMING ENVIRONMENTS

FIELD OF THE INVENTION

The present invention relates generally to graphical programming environments and more particularly to methods and systems for performing block processing of input data in the graphical programming environments. In the block processing of input data, the input data are partitioned into a plurality of data blocks, which are smaller sections of the input data, and each of the data block is processed.

BACKGROUND OF THE INVENTION

Various classes of block diagrams describe computations that can be performed on application specific computational hardware, such as a computer, microcontroller, FPGA, and custom hardware. Classes of such block diagrams include time-based block diagrams, such as those found within Simulink®, from The Math Works, Inc. of Natick, Mass., state-based and flow diagrams, such as those found within Stateflow®, from The Math works, Inc. of Natick, Mass., and data-flow diagrams. A common characteristic among these various forms of block diagrams is that they define semantics on how to execute the diagram.

Historically, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last few years with the advent of software packages, such as Simulink®. Such packages provide sophisticated software platforms with a rich suite of support tools that makes the analysis and design of dynamic systems efficient, methodical, and cost-effective.

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, etc. Professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans. The term "model-based design" is used to refer to the use of block diagram models in the development, analysis, and validation of dynamic systems.

The graphical programming environments may provide tools for implementing data processing systems that generally consist of a cascade of components performing a series of data operations to input data in order to obtain a set of desired output data. In most applications, such data processing systems are required to carry out the processing of the input data in real time to produce the output data.

In many applications including image or video processing systems, the input data have the dimensions of a matrix and includes a large amount of data to be processed. Temporary storage of the processed copies of such large signals imposes a heavy burden in terms of memory use. Alternatively, we can perform the operation by breaking down the input signal into smaller segments called data blocks, applying the same processing on each data block and reconstruct the processed signal. This kind of operation is known as block processing. Since the size of the data block is much smaller than the input signal, in block processing the requirements in terms of temporary memory use are greatly reduced.

SUMMARY OF THE INVENTION

The present invention provides methods and systems for performing block processing of input data in graphical programming environments. In the block processing of the present invention, the input data may have any dimensionality. The input signal that is to be processed is partitioned into a plurality of data blocks. Users may specify how to divide the input data into data blocks, for example, by designating the size of the input data to be processed and the size of the data blocks the input signal is partitioned into a total number of data blocks to be processed. Users may also designate a data processing function for processing each block of the input data. The blocks of the processed data are reassembled to generate output data. If the size of the output data is smaller than or equals to the size of the input data, the present invention is able to perform in-place block processing of the input data in which the blocks of the processed data are overwritten on the blocks of the input data. The output data may share memory space with the input data so that the block processing of the present invention saves memory space in processing the input data.

In accordance with one aspect of the present invention, a method is provided for performing block processing of input data in an electronic device that provides graphical programming environments. A graphical element is displayed on the display of the electronic device so that the graphical element receives the input data. The graphical element represents a block processing model that performs block processing of the input data. In response to an action taken by users in connection with the graphical element, a user interface is provided for entering control data of the block processing model. The control data set up an operation mode of the block processing model. The block processing model performs block processing of the input data based on the control data of the block processing model.

In another aspect of the present invention, a method is provided for performing block processing of input data in an electronic device that provides graphical programming environments. The input data is partitioned into blocks based on control data entered by users. An index is generated for a block of the input data to specify the block in the input signal. The data block is selected based on the index of the block and processed. The processed data is assigned to a location in the output data, in which the location of the processed data in the output data is determined by the index of the block.

In still another aspect of the present invention, a system is provided for performing block processing of input data. The system is implemented in an electronic device that provides graphical programming environments. The system includes an iterator for receiving the input data and dividing the input data into a plurality of data blocks. The system also includes a data processing unit for processing a block of the input data. The iterator enables the data processing unit to repeat the data processing of the input data on each of the blocks.

In yet still another aspect of the present invention, a system is provided for performing block processing of input data in an electronic device that provides graphical programming environments. The system includes a pointer generator for iteratively generating a pointer of each block of the input data. The system also includes a data processing unit for processing each block of the input data designated by the pointer. The pointer represents a location of each data block in memory space.

By providing block processing of input data, the present invention enables the processing of a large amount of data in real time. In addition, the present invention enables in-place processing of the input data when the size of the input data is larger than or equals to the size of the output data. As a result, the present invention saves memory space in processing the input data.

BRIEF DESCRIPTION OF THE DRAWINGS

The aforementioned features and advantages, and other features and aspects of the present invention, will become better understood with regard to the following description and accompanying drawings, wherein.

DETAILED DESCRIPTION

The illustrative embodiment of the present invention concerns graphical programming environments, such as block diagram programming environments, provided on an electronic device. Block diagrams are the representations of real-world systems through graph containing nodes (called blocks) interconnected by arcs (called lines). Blocks are functional entities that perform operations on the data being processed by the systems. The lines represent data (called signals) being communicated between the various blocks. One of skill in the art will appreciate that the block diagrams are an illustrative graphical programming environment and the present invention may apply to other types of graphical programming environments, such as state flowchart programming environments.

The graphical programming environments of the illustrative embodiment of the present invention provide a block processing block that performs the block processing of input data. The block processing block is a functional node in the block diagram environment, which processes input data in sections called data blocks (smaller sections of the input signals), rather than the entire input data at once. The block processing block receives the input data and divides into blocks the input data that is to be processed by the block processing block. The block processing block iteratively processes each block of the input data and combines the resulting blocks of the processed data to generate output data. One of skill in the art will appreciate that although the block processing block is provided in a single block in the illustrative embodiment of the present invention, the block processing may be implemented in multiple blocks that may include the components of the block processing block.

The block processing block performs the data processing of input data in blocks depending on the users' selection of the operation mode of the block processing block. The operation mode of the block processing block is determined by users entering the parameters of the block processing block, such as the size of data blocks, the size of input data to be processed, etc. The block processing block may perform in-place processing of the input data if the size of the output data is smaller than or equals to the size of the input data. In the in-place block processing of the input data, the blocks of the processed data are overwritten on the blocks of the input data. As a result, the output data shares memory space with the input data to save the memory space for the output data.

Figure 1:
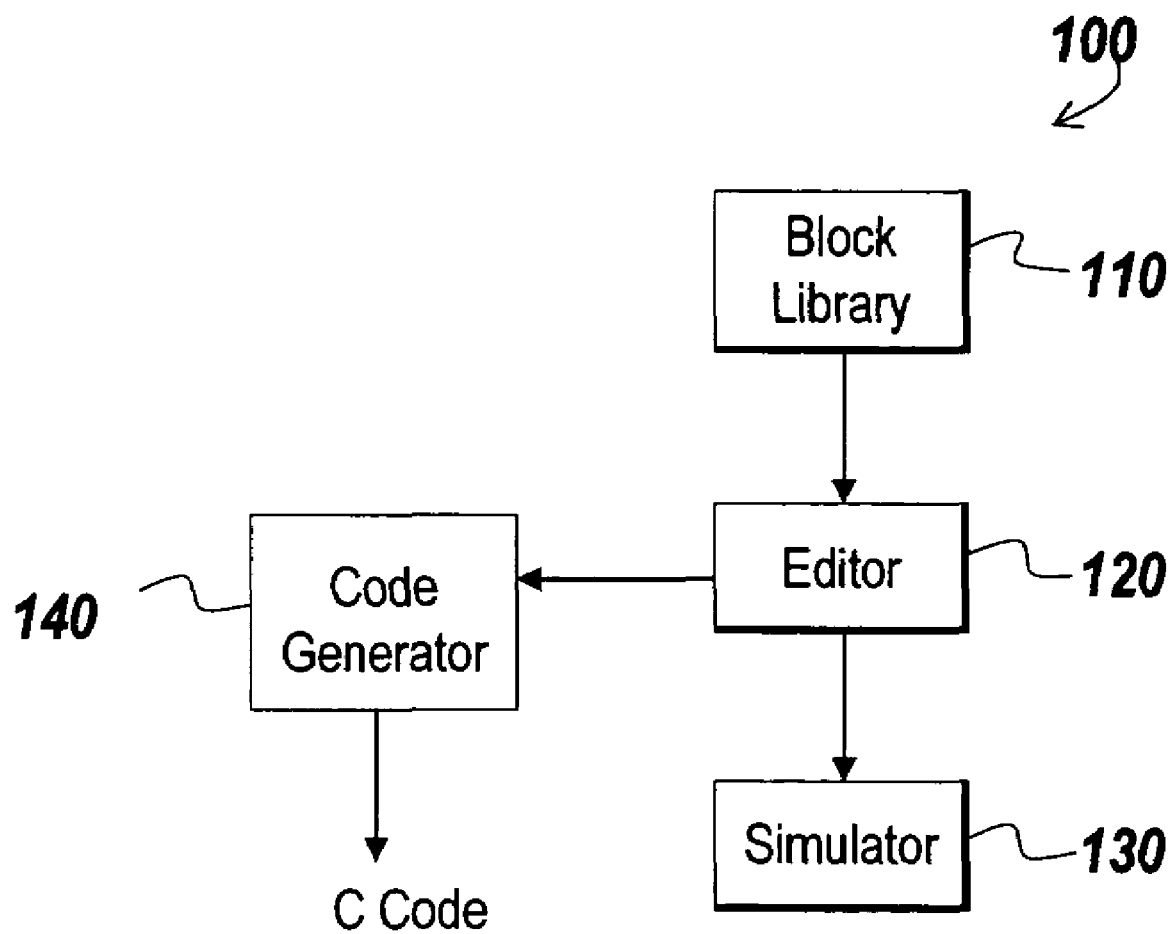
FIG. 1 is an exemplary graphical programming environment that utilizes blocks to represent models in the illustrative embodiment of the present system.

FIG. 1 is an exemplary graphical programming environment in which blocks are utilized to represent models in the illustrative embodiment of the present invention. The environment 100 includes a block library block 110, an editor 120, a simulator 130 and a code generator 140. The code generator 140 may generate source code for the models in the illustrative embodiment of the present invention.

The block library 110 contains blocks of application specific models that support the modeling and simulation of systems. The blocks in the block library 110 are incorporated into the models of the systems designed using the modeling and simulation tool 130. The blocks provided from the block library 100 are represented in rectangular blocks in the illustrative embodiment of the present invention. One of skill in the art will appreciate that the models can be represented in other graphical symbols or textual symbols. The model blocks provided by the block library 110 include a block processing block 300 (see FIG. 3) for processing input data in blocks. The block library 110 may also include the component blocks of the block processing block that may be combined to implement a block processing function. One of skill in the art will appreciate that the block processing in the illustrative embodiment of the present invention may implemented in multiple blocks that may include the components of the block processing block. An illustrative embodiment of the block library 110 may be found in Simulink® Blocksets, such as DSP Blockset, Fixed-point Blockset and Communications Blockset, from The Math works, Inc. of Natick, Mass. The Blocksets provide models and utilities for the development and integration of models for target systems and sub-systems of the target systems.

The editor 120 and simulator 130 provide graphical simulation and prototyping environment for modeling, simulating, and analyzing target systems. The editor 120 incorporates the blocks provided from the block library 110 into the target systems. The target systems designed in the editor 120 are simulated by the simulator 130 to analyze the behavior of the designed target systems. Exemplary editor 120 and simulator 130 may be found in Simulink®, from The Math works, Inc. of Natick, Mass. The Blockset operates in Simulink®.

Simulink® enables users to design a block diagram for a target system, simulate the system's behavior, analyze the performance of the system, and refine the design of the system. Simulink® allows users to design target systems through a user-interface that allows drafting of block diagram models of the target systems. All of the blocks in the block library 110 are available to users when the users are building the block diagram of the target systems. Individual users may be able to customize this model block to: (a) reorganize blocks in some custom format, (b) delete blocks they do not use, and (c) add custom blocks they have designed. The blocks may be dragged through some human-machine interface (such as a mouse or keyboard) from the block library 110 on to the window (i.e., model canvas). Simulink® includes a block diagram editor that allows users to perform such actions as draw, edit, annotate, save, and print out block diagram representations of target systems. The block diagram editor is a graphical user interface (GUI) component that allows drafting of block diagram models by users. In Simulink®, there is also a textual interface with a set of commands that allow interaction with the graphical editor. Using this textual interface, users may write special scripts that perform automatic editing operations on the block diagram. Simulink® also allows users to simulate the designed target systems to determine the behavior of the systems. Simulink® includes a block diagram execution engine that carries out the task of compiling and linking the block diagram to produce an "in-memory executable" version of the model that is used for generating code and/or simulating a block diagram model.

The code generator 140 generates customizable C-code directly from the block diagrams of the models designed using the editor 120. By automatically generating source code, the code generator 140 enables rapid prototyping, hardware-in-the-loop simulations, and desktop rapid simulation of the models designed in the editor 120. The code generation tool 140 may generate efficient source code for embedded systems applications. One of skill in the art will appreciate that source code is an illustrative code that is generated in the code generator 140 and the code generator 140 may generate different code for the models, such as Ada. Real-Time Workshop from The Math works, Inc. of Natick, Mass., is an exemplary code generation tool 140.

One of skill in the art will appreciate that the graphical programming environment 100 is not limited to block diagram programming environments, but rather includes any other graphical programming environments, such as state flowchart graphical programming environments. Stateflow® from The Math works, Inc. of Natick, Mass., provides an exemplary state flowchart modeling environment. Stateflow® provides a graphical environment for modeling and designing event-driven models. Stateflow® enables users to generate state flowcharts that graphically represent hierarchical and parallel states and the event-driven transitions between the states of the models. Simulink® that is seamlessly interfaced with Stateflow® may execute the models and analyze the behavior of the models based on the state flowcharts created in Stateflow®.

Figure 2:
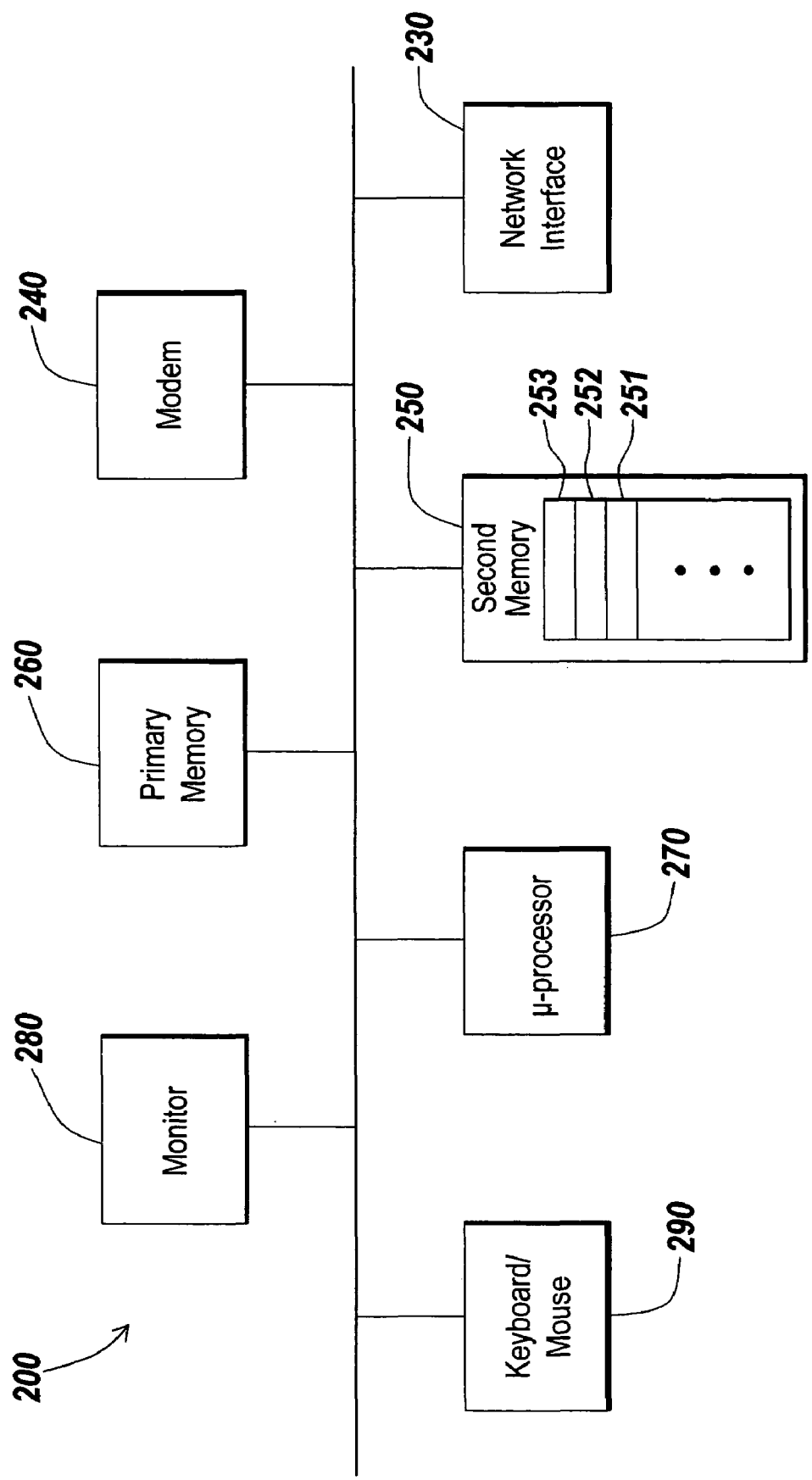
FIG. 2 is an electronic device suitable for practicing the illustrative embodiment of the present invention.

FIG. 2 is an exemplary electronic device 200 suitable for practicing the illustrative embodiment of the present invention. The electronic device 200 includes a network interface 230, a MODEM 240, a secondary memory 250, a primary memory 260, a microprocessor 270, a monitor 280 and a keyboard/mouse 290. The microprocessor 270 controls each component of the electronic device 200 to run the software tools in the graphical programming environment 100 properly. The electronic device 200 receives the data necessary for controlling the design and simulation of a target system through the keyboard/mouse 290, such as the control data to set up the operation modes of the block processing block 300 (see FIG. 3). The electronic device 200 displays in the monitor 280 the result generated in the graphical programming environment 100. The primary memory 260 fetches from the secondary memory 250 and provides to the microprocessor 270 the codes that need to be accessed quickly by the microprocessor 270 to operate the electronic device 200 and to run the graphical programming environment 100. The secondary memory 250 usually contains software tools for applications. The secondary memory 250 includes, in particular, code 251 for the block library 110, code 252 for the editor 120, and code 253 for the simulator 130. The network interface 230 and the MODEM 240 enable the electronic device 200 to communicate with other electronic devices through communication networks, such as Internet, intranet, LAN (Local Area Network), WAN (Wide Area Network) and MAN (Metropolitan Area Network). The communication facilities may support for the distributed implementations of the present invention.

Figure 3:
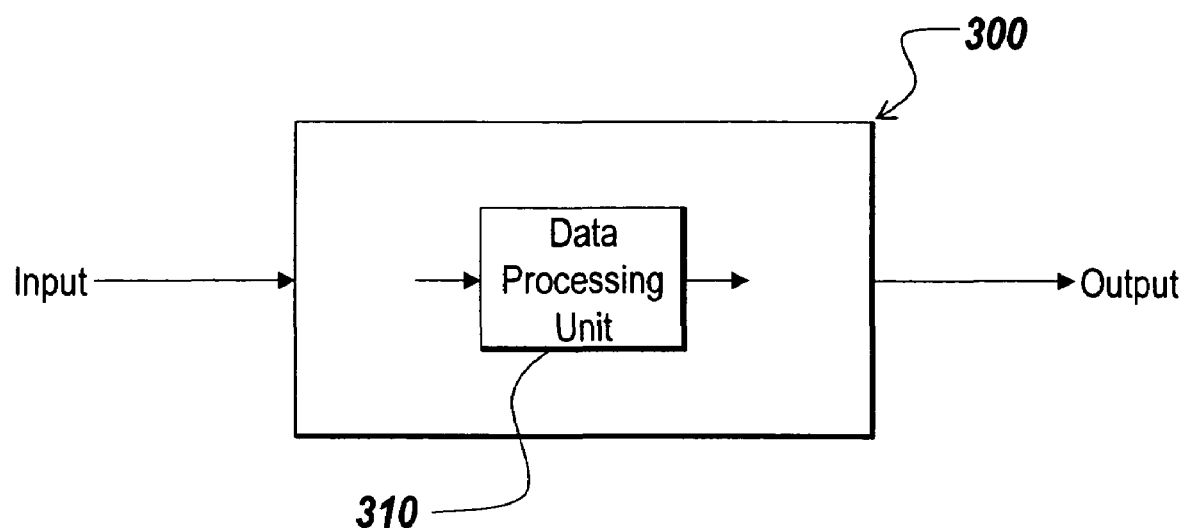
FIG. 3 is an exemplary block for use in a block processing model provided in the graphical programming environment of the illustrative embodiment of the present invention depicted in FIG. 1.

FIG. 3 is an exemplary block processing block 300 provided by the block library 110 in the graphical programming environment 100 of the illustrative embodiment of the present invention depicted in FIG. 1. The block processing block 300 implements an iterative system within a graphical programming environment that is capable of performing the block processing operation. The block processing block 300 receives input data and generates output data. The input data may have any dimensionality. In image or video data processing systems, for example, the input data has the dimension of a matrix and includes a large amount of data to be processed. The block processing block 300 includes a sub-block that represents a data processing unit 310 performing a data processing function on the input data. The data processing function of the data processing unit 310 may be specified by users. For example, the block processing block 300 processes each 8×8 block of the 512×512 input data with a single DCT (Discrete Cosine Transform) data processing unit 310.

The block processing block 300 partitions the input data into blocks, sends each block of the input data to the data processing unit 310, and forms the output data by placing each block of the processed data at an appropriate location in the output data. The operation mode of the block processing block 300 is determined by users specifying the parameters of the block processing block 300, such as the size of the blocks and the range of input data over which block processing is performed. The parameters of the block processing block 300 are described in more detail with reference to FIG. 4. Based on the pre-determined operation mode of the block processing block 300, the entire input data or a portion of the input data is partitioned into blocks. A data processing function is operated on each block of the input data by the data processing unit 310. The output data is reconstituted by reassembling the blocks of the processed data in the same order as the blocks of the input data are processed.

The block processing block 300 may be utilized in many applications including image compression and speech coding. In JPEG (Joint Photographic Expert Group) image compression, the data processing unit 310 may be selected to perform JPEG image compression algorithm so that a large amount of input image data may be compressed utilizing the block processing. In compression phases, the input image is partitioned into blocks and each block is processed by the data processing unit 310 that performs a DCT (Discrete Cosine Transform) transform. In decompression phases, the inverse DCT is applied on each block and finally the output data is reconstructed. One of skill in the art will appreciate that the block processing block 300 may be used in MPEG (Moving Picture Experts Group) video compression. In speech coding applications, the speech signal is processed within a frame of 10-30 ms. Usually the input frame is sub-divided into 2 to 4 sub-frames where the data processing unit 310 may perform same sets of operations on the samples of the sub-frames. The speech coding sub-frames may have overlapping samples across the sub-frame boundaries. The overlap is described below in more detail with reference to FIG. 5A.

Figure 4:
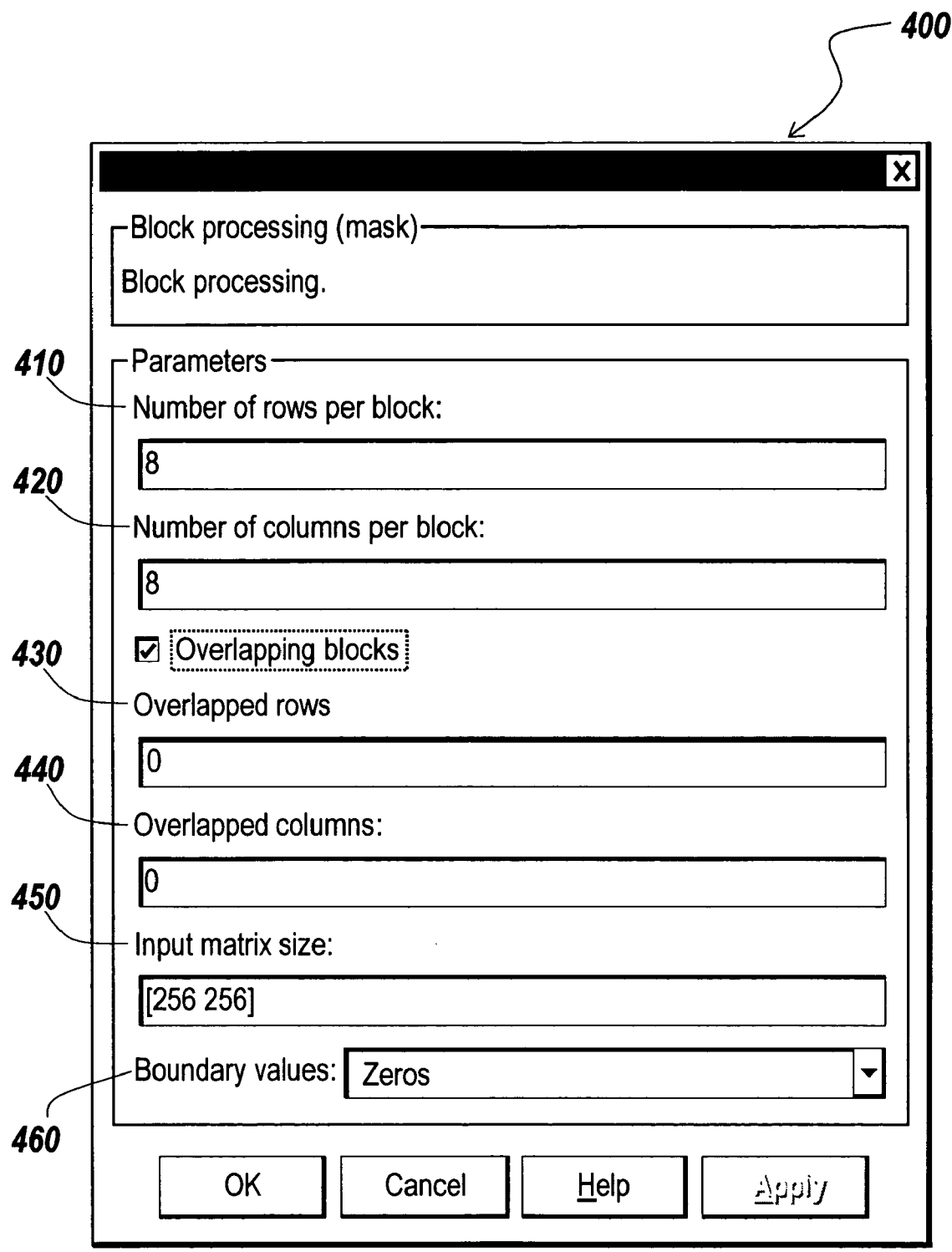
FIG. 4 is an exemplary graphical user interface (GUI) for entering the parameters of a block processing block to set up the operation mode of the block processing block in the illustrative embodiment of the present invention depicted in FIG. 3.

FIG. 4 is an exemplary graphical user interface (GUI) 400 for entering the parameters of the block processing block 300 to set up the operation mode of the block processing block 300 in the illustrative embodiment of the present invention depicted in FIG. 3. One of skill in the art will appreciate that the GUI 400 is illustrative and the parameters of the block processing block 300 may be input through a textual user interface, such as a command line interface. The GUI 400 provides some blanks for users to input the parameters of the block processing block 300. The parameters may include the number of rows per block 410, the number of columns per block 420, overlapped rows 430, overlapped columns 440, the size of input data 450, and boundary values 460. One of skill in the art will appreciate that the parameters provided in the GUI 400 are illustrative and the GUI 400 may provide blanks to input additional parameters, such as the data processing function of the data processing unit 310 and the order of blocks traversing the input data. The order of blocks traversing the input data will be described below in more detail with reference to FIGS. 5C-5E.

The number of rows per block 410 and the number of columns per block 420 determine the size of blocks in the input data. One of skill in the art will appreciate that the GUI 400 may include a different set of parameters to determine the size of blocks, such as the number of blocks along the rows of the input data to be processed and the number of blocks along the columns of the input data to be processed.

Figure 5A:
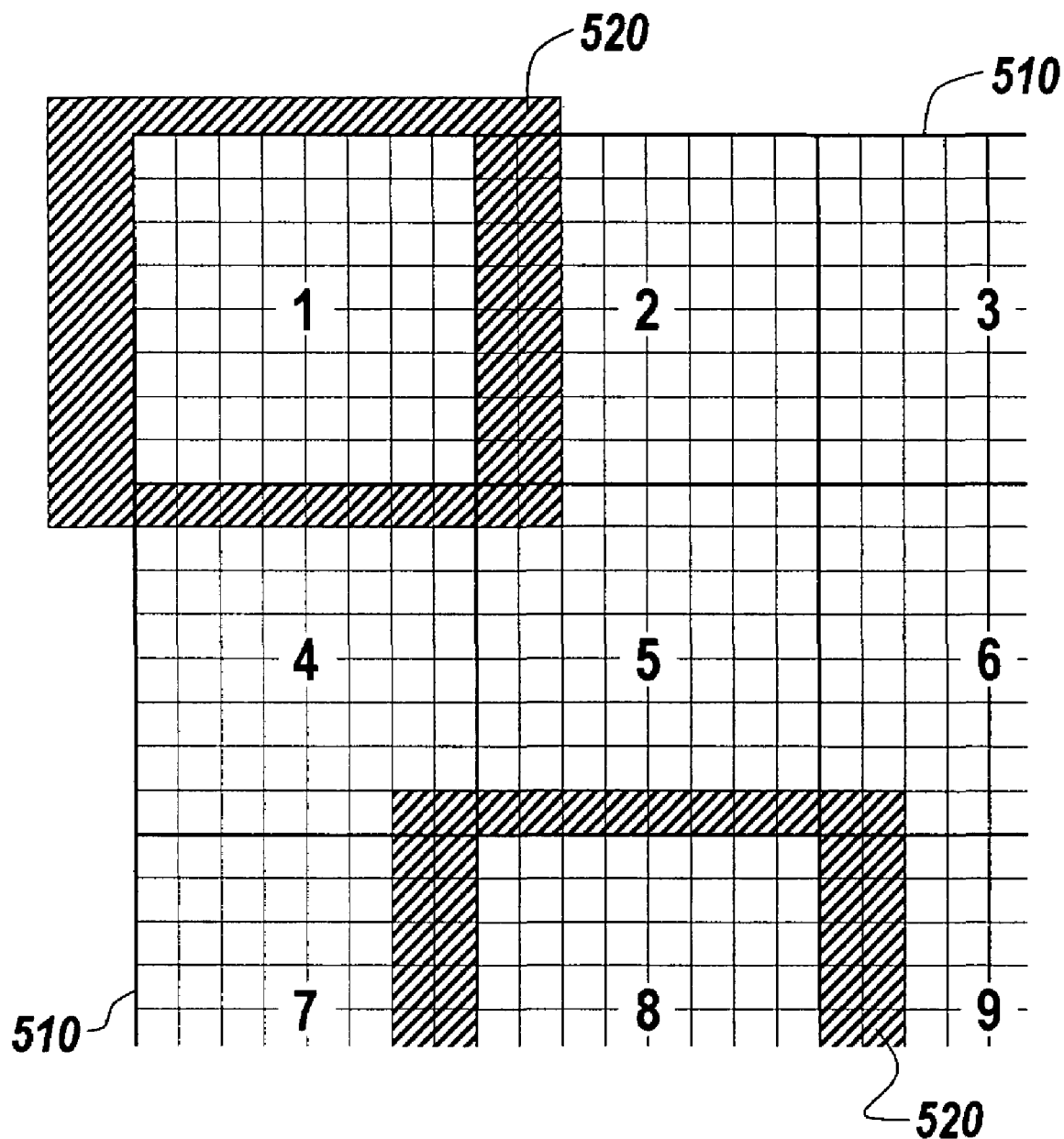
FIG. 5A is an example of input data illustrating the overlapped rows and columns of each block entered through the GUI depicted in FIG. 4 in the illustrative embodiment of the present invention.
Figure 5B:
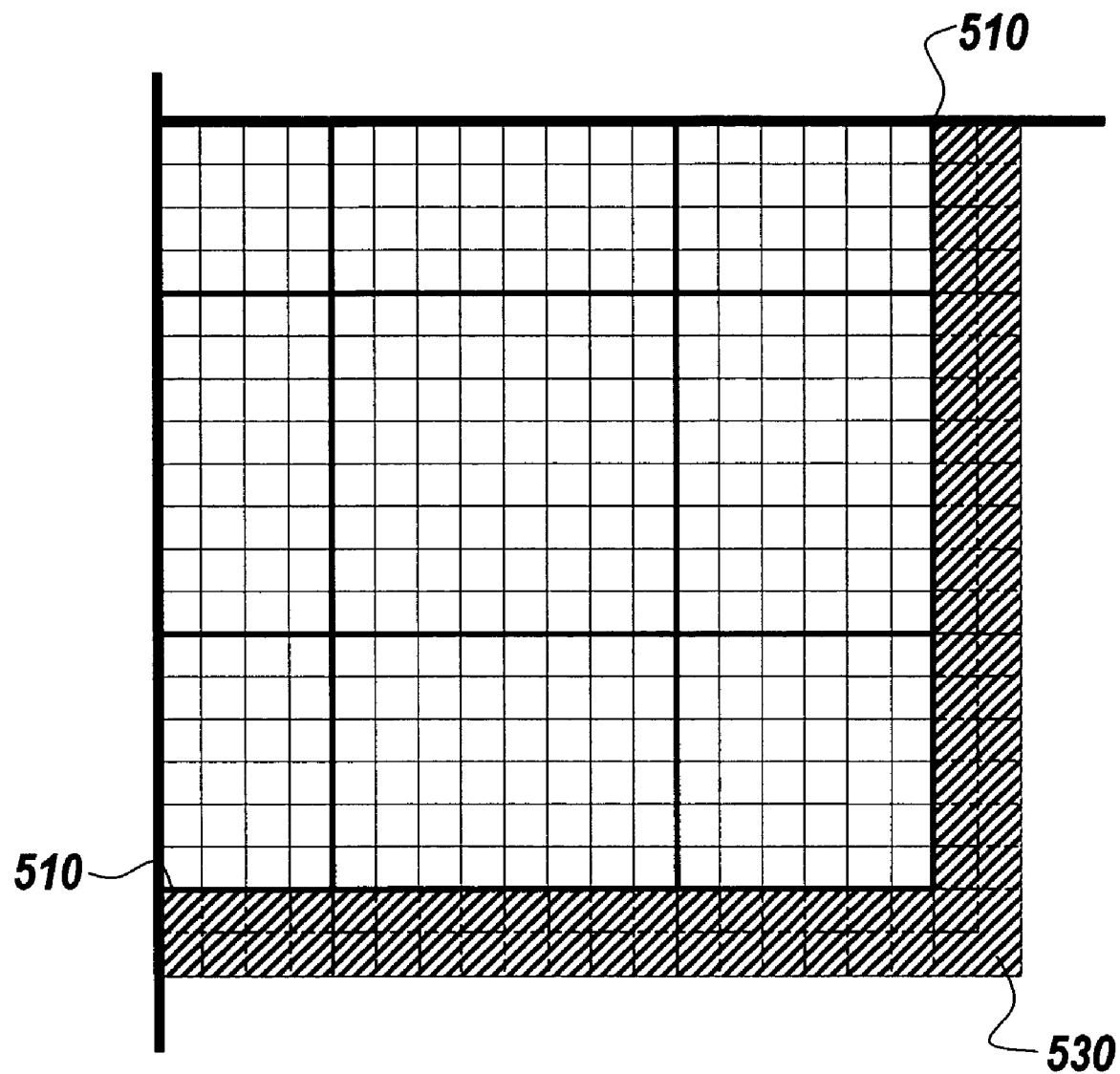
FIG. 5B is an example of input data illustrating the padding process of input data in the illustrative embodiment of the present invention.

The overlapped rows 430 and overlapped columns 440 determine the overlaps of each block with adjacent blocks. The overlaps are extra rows and columns of outside a data block whose values are taken into account when processing the block. FIGS. 5A is an exemplary input data illustrating the overlapped rows and columns of each block in the input data. In FIG. 5A, the input data is partitioned into data blocks, where these data blocks have a size of an 8 by 8 matrix in the illustrative embodiment of the present invention. Each block of the input data has overlapped with adjacent blocks by 2 columns and a row. Each 8 by 8 block has a one-row overlap above and below, and a two-column overlaps on each side. The shaded portion 520 indicates the overlap. The GUI 400 may include a blank to input boundary values 460 for padding. FIG. 5B is an exemplary input data illustrating the padding process of the input data in the illustrative embodiment of the present invention. The input data is partitioned into blocks and each of blocks has an 8 by 8 matrix. If the blocks don't fit exactly over the input data, padding values are added to the shaded area 530, the bottom and right of the input data, so that the blocks match with the input data to be processed. In addition, the overlaps shown in FIG. 5A are extended beyond the boundary 510 of the input data. The padding process also adds the padding values to the overlap 520 outside the boundary 510 of the input data.

Figure 5C:
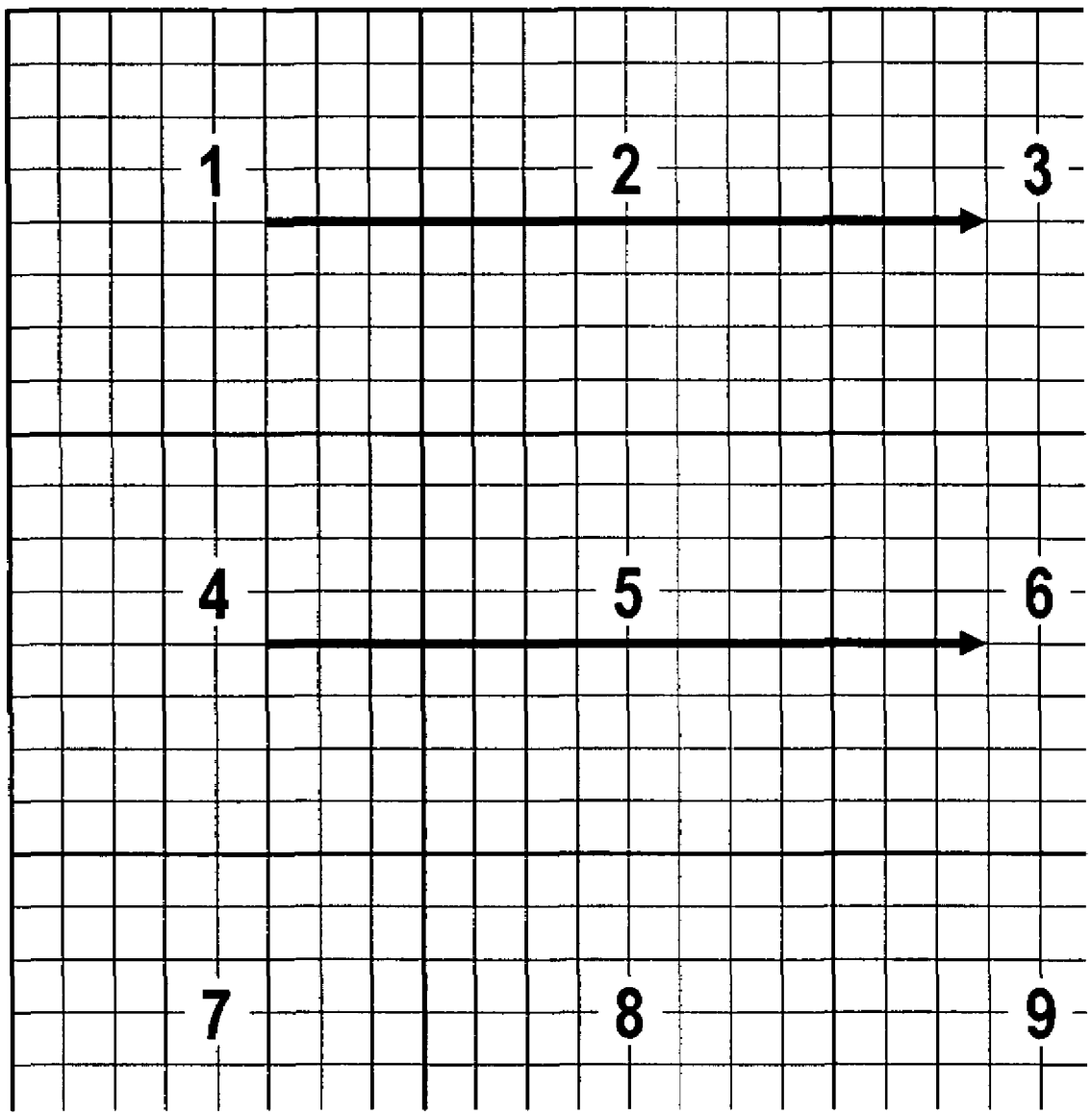
FIG. 5C is an example of input data illustrating the horizontal (row-wise) order of blocks traversing input data in the illustrative embodiment of the present invention.
Figure 5D:
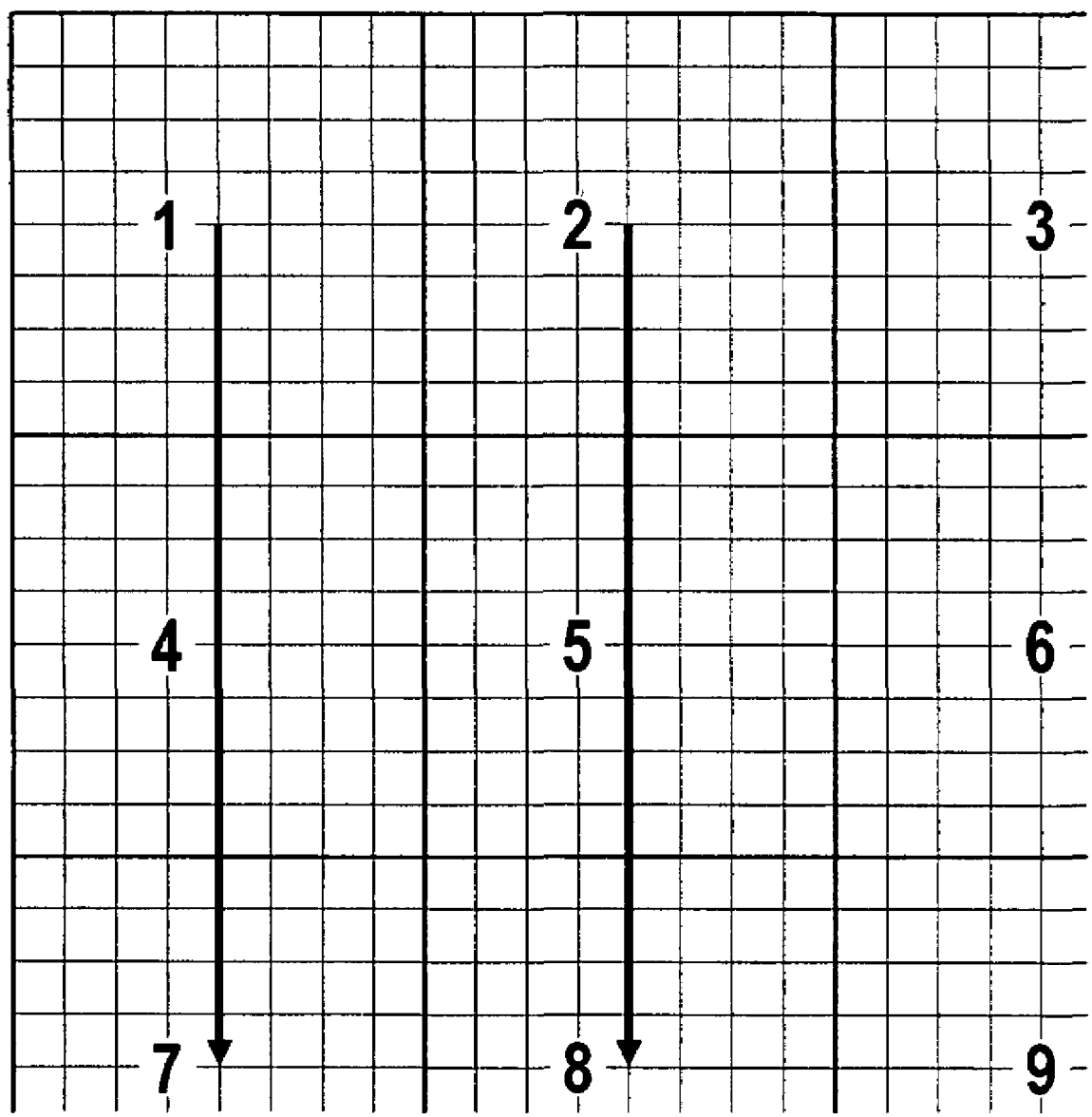
FIG. 5D is an example of input data illustrating the vertical (column-wise) order of blocks traversing input data in the illustrative embodiment of the present invention.
Figure 5E:
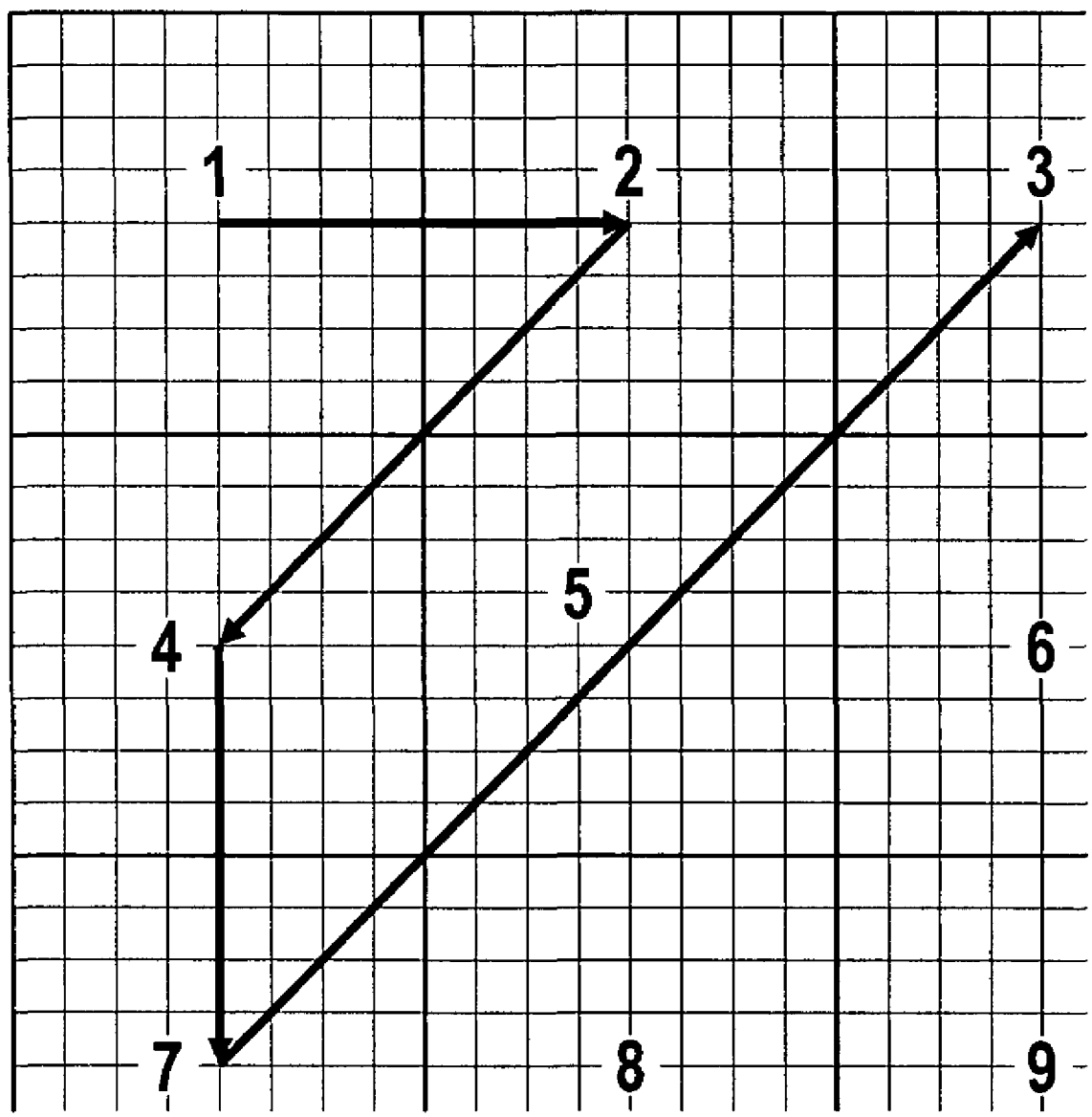
FIG. 5E is an example of input data illustrating the zigzag order of blocks traversing input data in the illustrative embodiment of the present invention.

Users may select the order of the blocks traversing the input data to be processed by selecting an index generator, which is a codeword generating function. The data blocks may be traversed with any arbitrary ordering specified by the user. For example, the blocks may be processed in a horizontal (row-wise), vertical (column-wise) or zigzag direction, as depicted in FIGS. 5C-5E, respectively. One of skill in the art will appreciate that the orders shown in FIGS. 5C-5E are illustrative and the blocks may be traversed in other orders, such as diagonal and anti-diagonal directions. The blocks may also be processed in a user-defined order. For example, if users input a specific order for processing the blocks, for example [1, 3, 5, 7, 9, . . . ], the blocks of the input data are processed in the order of Block 1, Block 3, Block 5, Block 7, Block 9, . . . .

Figure 6:
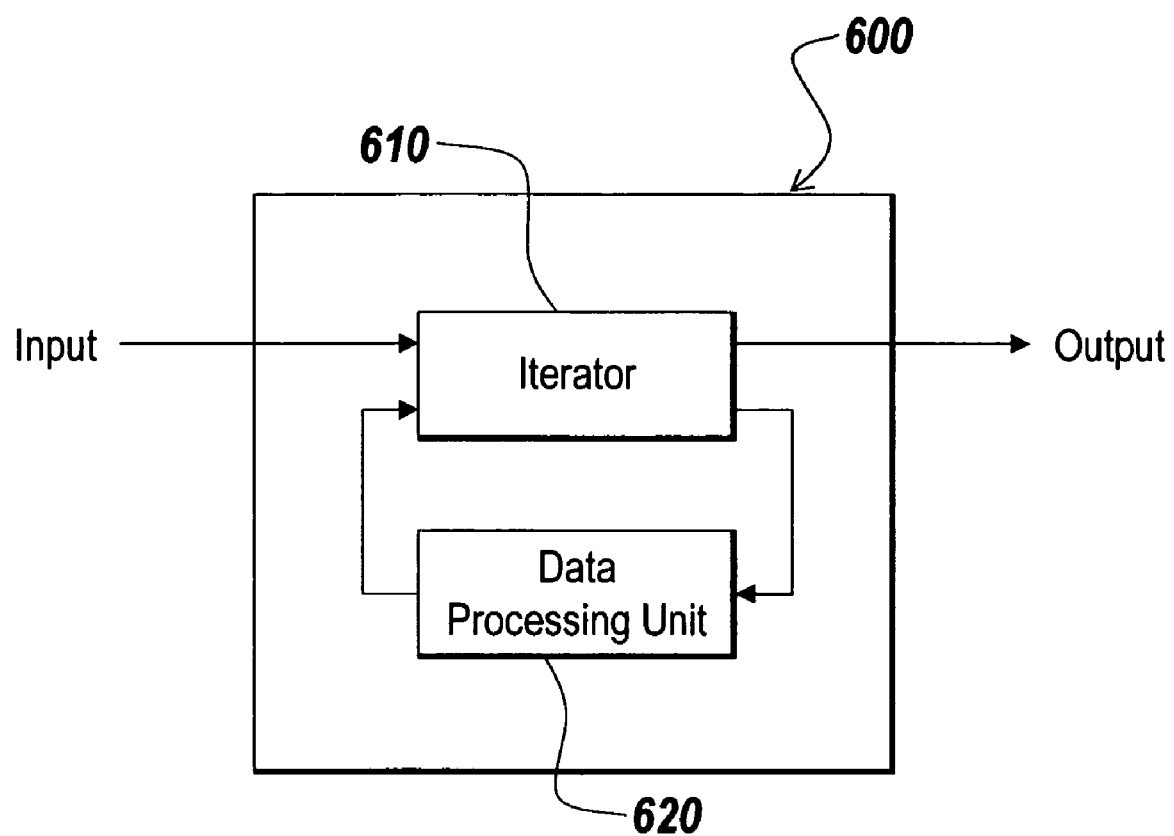
FIG. 6 is an exemplary block processing block in the illustrative embodiment of the present invention.

FIG. 6 is an exemplary block processing block 600 that performs block processing of input data in the illustrative embodiment of the present invention. The block processing block 600 includes an iterator 610 and a data processing unit 620. The iterator 610 receives the input data, and generates output data. Based on the operation mode of the block processing block 600 selected by users, the iterator 610 selects a block of the input data to be processed and transfers the selected block of the input data to the data processing unit 620. The data processing unit 620 processes the selected block of the input data and returns a block of processed data to the iterator 610 that in turn places the block of the processed data in the output data. The current block under processing may be visually depicted within the environment 100. This depiction may be useful in debugging operation. One of skill in the art will appreciate that the block of the processed data may have a different size than the block of input data depending on the data processing function of the data processing unit 620 defined by users. The location of the block of the processed data in the output data is determined based on the location of the selected block in the input data. The block processing block 600 iterates these steps with all of the blocks of the input data to be processed.

Figure 7:
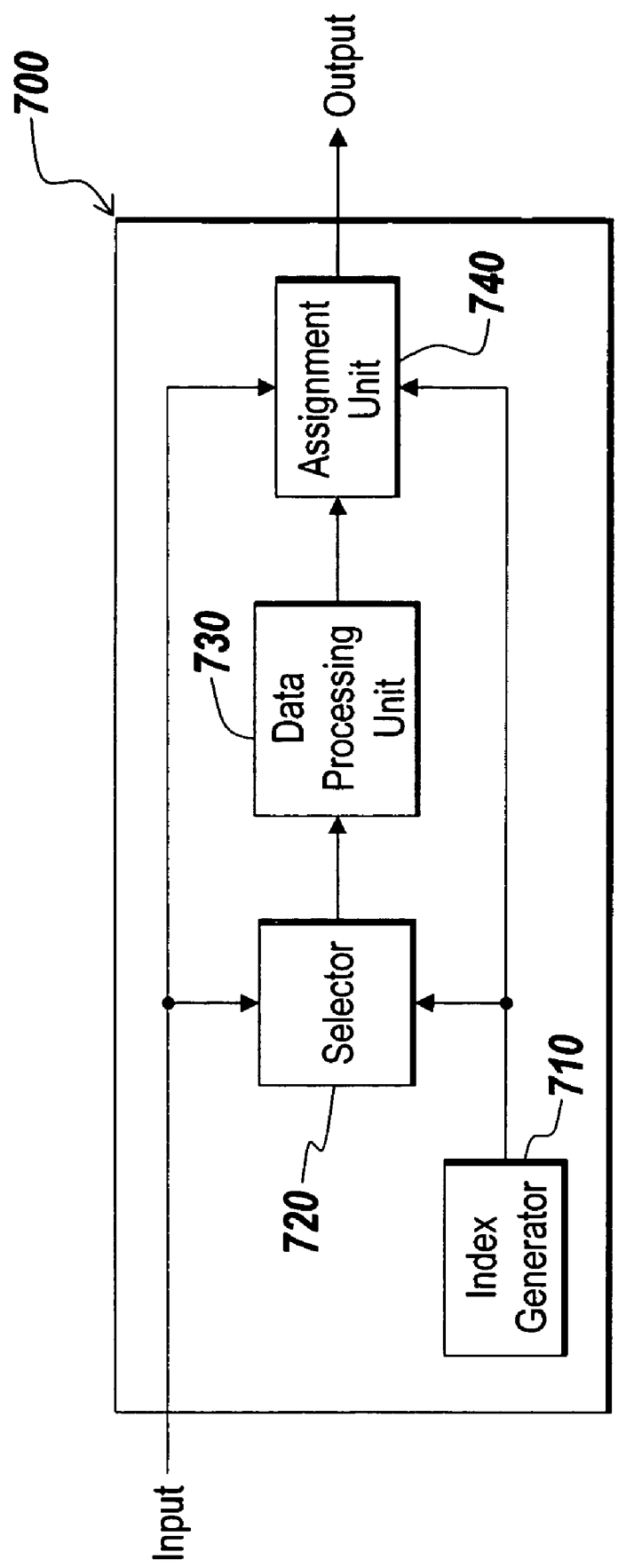
FIG. 7 is another exemplary block processing block in the illustrative embodiment of the present invention.

FIG. 7 is another exemplary block processing block 700 that performs block processing of input data in the illustrative embodiment of the present invention. The block processing block 700 includes an index generator 710, a selector 720, a data processing unit 730 and an assignment unit 740. The selector 720 and the assignment unit 740 receive the input data and the assignment unit 740 produces output data. The index generator 710 generates code-words or indices for the blocks of the input data that generally contain one or more integers. Based on the operation mode of the block processing block, the index generator 710 generates iteratively a series of code-words or indices that specify exactly what elements of the input data are selected to form a block in the iteration of the bock processing. The indices of the blocks are determined to specify both of the blocks of the input data to be processed and the locations of the blocks of the processed data in the output data. The indices of the blocks generated by the index generator may be a scalar or a vector. The block index uniquely identifies all samples contained in the block. The scalar or vector index is necessarily of reduced dimensionality with respect to the dimension of the data block. The index generator is capable of a generalized addressing scheme to uniquely identify the sub-units of the input signal. In this generalized addressing scheme, the samples composing the sub-units of the input signal may not necessarily be adjacent elements in memory. Let i=1, 2, 3, ..., n be the index of the iteration, the address of the sub-unit elements can be any function f(i) applied to the iteration index. For example, the block index codeword may be defined as a simple linear function of i, $f(i)=a+bi$, where a is a starting index and b is an index increment. Another exemplary index of a block may include [starting row, ending row] and [starting column, ending column] of the block. One of skill in the art will appreciate that the index may be in different forms, for example, using the offsets of the ending row/column from the starting row/column of each block. The selector 720 and assignment unit 740 receives the indices of the blocks of the input data. The selector 720 selects a block based on the index of the block and transfers the selected block to the data processing unit 730. The data processing unit 730 processes the transferred block of the input data and outputs a block of processed data. The assignment unit 740 receives the block of the processed data and assigns the block of the processed data in the output data based on the index of the block of the input data. One of skill in the art will appreciate that different index generators may be used for the selector 720 and the assignment unit 740. The block processing block 700 iterates these steps with all of the blocks of the input data to be processed. The block processing block 700 may perform in-place processing of the input data, which requires the output data to share memory space with the input data. In the in-place processing, output data is overwritten on the input data. The in-place block processing is described below in more detail with reference to FIG. 8.

Figure 8:
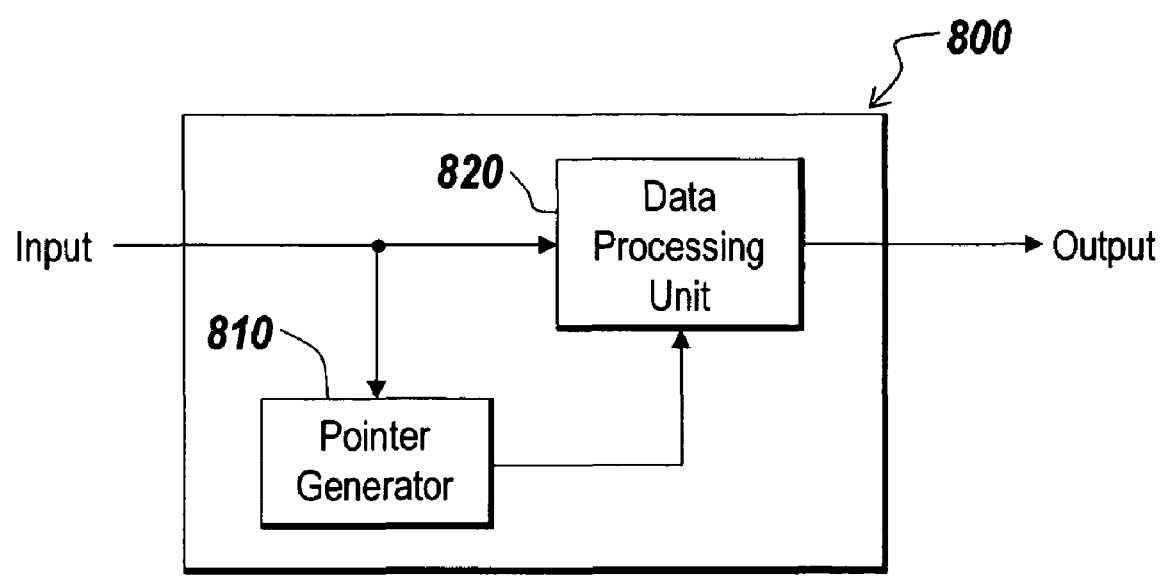
FIG. 8 is still another exemplary block processing block in the illustrative embodiment of the present invention.

FIG. 8 is still another exemplary block processing block 800 that may perform in-place block processing of input data in the illustrative embodiment of the present invention. The block processing block 800 includes a pointer generator 810 and a data processing unit 820. The pointer generator 810 and the data processing unit 820 receive the input data. Based on the operation mode of the block processing block 800 selected by users, the pointer generator 810 generates a pointer to each block of the input data. The pointer to a block of the input data represents the location of the block in memory space. The pointer of the block may include a pointer to the first element of the block. One of skill in the art will appreciate that the pointer to the block may include a pointer to other elements of the block that can specify the block in the memory space, such as a pointer to the last element of the block. The pointer to the block of the input data is passed to the data processing unit 820. The data processing unit 820 processes the block of the input data specified by the pointer. On the completion of processing the block of the input data, the data processing unit 820 overwrites the block of the processed data on the location in memory space specified by the pointer to the block received from the pointer generator 810. The bock processing block 800 iterates these steps with all of the blocks of the input data to be processed. Hence at the end of the iterative process, output data is completely formed. One of skill in the art will appreciate that in the in-place processing of the input data, the size of the input data is generally larger than or equals to the size of the output data.

In summary, the illustrative embodiment of the present invention provides block processing of input data in graphical programming environments. The illustrative embodiment of the present invention provides a block processing block that performs the block processing of the input data. One of skill in the art will appreciate that the block processing of the input data may be implemented in multiple blocks that are the components of the block processing block. The portion to be processed in the input data is partitioned into blocks and the blocks of the input data are processed in an order designated by users. The blocks of the processed data are combined in a same order as the blocks of the input data are processed. The illustrative embodiment of the present invention also provides in-place block processing of the input data, in which the blocks of the processed data are overwritten on the memory space corresponding to the blocks of the input data. The in-place processing of the input data enables the output data to share memory space with the input data and save memory space for the output data.

It will thus be seen that the invention attains the objectives stated in the previous description. Since certain changes may be made without departing from the scope of the present invention, it is intended that all matter contained in the above description or shown in the accompanying drawings be interpreted as illustrative and not in a literal sense. For example, the illustrative embodiment of the present invention may be practiced in any graphical programming environment that provides data processing of input data. Practitioners of the art will realize that the sequence of steps and architectures depicted in the figures may be altered without departing from the scope of the present invention and that the illustrations contained herein are singular examples of a multitude of possible depictions of the present invention.

We claim:

1. A computer-implemented system for performing block processing of input data in a graphical programming environment, wherein the graphical programming environment processes models that mathematically represent real systems and the input data is partitioned into a plurality of data blocks, the computer-implemented system comprising:

an index generator for generating an address uniquely identifying each data block of the input data to be processed by a model in the graphical programming environment;

a selector for selecting a data block from the input data based on the address generated by the index generator;

a block processing unit operating on a data block to produce an output associated with the data block;

an iterator enabling repeated processing of data blocks of the input data based on control parameters entered by a user; and an output generator for reassembling processed data blocks based on the address of the blocks to generate an output of the system.

2. The system of claim 1 wherein the data block address generated by the index generator is one of a scalar or a vector, and the data block address is a codeword capable of uniquely identifying all samples contained in the data block.

3. The system of claim 2 wherein the scalar or vector address is of reduced dimensionality with respect to a dimension of the data block.

4. The system of claim 1 wherein the index generator is capable of a generalized addressing scheme to uniquely identify the data blocks of a large input data structure, wherein samples composing the data blocks of the input data may not necessarily be adjacent elements in memory.

5. The system of claim 2 wherein if i=1, 2, 3, . . . , n is an index of the iterator, the address of the blocks is a function f(i) applied to the index.

6. The system of claim 5 wherein the data block address codeword is defined as a simple linear function of i, $f(i)=a+bi$, where a is a starting index and b is an index increment.

7. The system of claim 1 wherein the index generator includes a plurality of outputs.

8. The system of claim 1 wherein different index generators are used for the selector and the output generator.

9. The system of claim 1 wherein the same index generator is used for the selector and the output generator.

10. The system of claim 1 wherein the control parameters include a size of the input data.

11. The system of claim 1 wherein the control parameters include a size of each block.

12. The system of claim 1 wherein the control parameters include an index generator codeword generating function defined over a set of positive integers, wherein data blocks are traversed with any arbitrary ordering specified by the user.

13. The system of claim 1 wherein the control parameters include a number of samples overlapped between adjacent data blocks.

14. The system of claim 1 wherein the control parameters include boundary values with samples having addresses outside the range of the original input signal.

15. The system of claim 1 wherein the system includes a block processing model implemented in block diagram modeling environments and automatic source code is generated to represent an operation of the block processing model.

16. The system of claim 15 wherein the block processing model is used in data flow and time-oriented simulation environments.

17. The system of claim 1 wherein the system enables in-place processing in which the input data may share memory space with the output data when a size of the input data is larger than or equals to a size of the output data.

18. A computer-implemented system for performing block processing of input data in a graphical programming environment, wherein the graphical programming environment processes models that mathematically represent real systems, the computer-implemented system comprising:

a block processing subsystem for iteratively generating an address uniquely identifying each data block of the input data to be processed by a model in the graphical programming environment, selecting a data block from the input data based on the address generated by the index generator; and a block processing unit operating on each data block to produce an output associated with the data block, wherein the block processing subsystem enables repeated processing of data blocks of the input data based on control parameters entered by a user and reassembles processed data blocks based on the address of the block to generate an output of the system, the control parameters including specifications of the processing unit operating on the data blocks.

19. The system of claim 18 wherein the control parameters include a size of the input data.

20. The system of claim 18 wherein the control parameters include a size of each block.

21. The system of claim 18 wherein the control parameters include any arbitrary ordering specified by the user through specifying any function defined over the set of positive integers.

22. The system of claim 18 wherein a current data block under processing is visually depicted within the graphical programming environments.

23. The system of claim 18 further comprising a dedicated block processing fabric for each block processing subsystem.

24. The system of claim 18 further comprising a global block processing fabric for all block processing subsystems, wherein settings and control parameters of each block processing subsystem are stored separately in a control variable.

25. The system of claim 18 wherein the control parameters include a number of samples overlapped between adjacent data blocks.

26. The system of claim 18 wherein the control parameters include boundary values with samples having addresses outside the range of the original input signal.

27. The system of claim 18 wherein the system includes a block processing model implemented in the graphical programming environments and automatic source code is generated to represent the operation of the block processing model.

28. The system of claim 18 wherein the block processing subsystem is used in data flow and time-oriented simulation environments.

29. The system of claim 18 wherein the input data may share memory space with the output data when a size of the input data is larger than or equals to a size of the output data.

30. A computer-implemented system for performing block processing of input data in a graphical programming environment, wherein the graphical programming environment processes models that mathematically represent real systems and are used to design a target system, the system comprising:

a pointer generator for iteratively generating a pointer for each block of the input data to be processed by a model in the graphical programming environment based on control parameters entered by a user, the control parameters including a number of samples overlapped between adjacent data blocks; and a processing unit for processing the input data of each block designated by the pointer, wherein the processing unit operates directly on the block of the input data specified by the pointer to produce output data, and the input and output data inherently share memory space.

31. The system of claim 30 wherein the control parameters include boundary values with samples having addresses outside the range of the original input signal.

32. The system of claim 30 wherein automatic source code is generated to represent the operation of the block processing model.

33. A computer-implemented method for performing block processing of input data in a graphical programming environment, the method comprising:
 generating an address uniquely identifying each data block of the input data to be processed by a model in the graphical programming environment, the address being one of a scalar or a vector and being a codeword capable of uniquely identifying all samples contained in the data block;
 selecting a data block from the input data based on the address;
 operating on each data block to produce an output associated with the data block;
 repeating the generating, selecting and operating steps for other data blocks of the input data based on control parameters entered by a user; and
 reassembling processed data blocks.

34. The method of claim 33 wherein the control parameters include a size of the input data.

35. The method of claim 33 wherein the control parameters include a size of each block.

36. The method of claim 33 wherein the control parameters include a number of samples overlapped between adjacent data blocks.

37. The method of claim 33 wherein the control parameters include boundary values with samples having addresses outside the range of the original input signal.

38. A computer-implemented method for performing block processing of input data in a graphical programming environment, the method comprising:
 generating a pointer for each block of the input data to be processed by a model in the graphical programming environment based on control parameters entered by a user, the control parameters including a number of samples overlapped between adjacent data blocks; and
 processing the input data of each block designated by the pointer to produce output data,
 wherein the input and output data inherently share memory space.

39. The method of claim 38 wherein the control parameters include boundary values with samples having addresses outside the range of the original input signal.

40. The method of claim 38 wherein automatic source code is generated to represent the operation of the block processing model.

41. A medium holding instructions executable in a computing device for performing block processing of input data in a graphical programming environment, said instructions comprising:
 instructions for generating an address uniquely identifying each data block of the input data to be processed by a model in the graphical programming environment, the address being one of a scalar or a vector and being a codeword capable of uniquely identifying all samples contained in the data block;
 instructions for selecting a data block from the input data based on the address;
 instructions for operating on each data block to produce an output associated with the data block;
 instructions for repeating the generating, selecting and operating steps for other data blocks of the input data based on control parameters entered by a user; and
 instructions for reassembling processed data blocks.

42. A medium holding instructions executable in a computing device for performing block processing of input data in a graphical programming environment, said instructions comprising:
 instructions for generating a pointer of each block of the input data to be processed by a model in the graphical programming environment based on control parameters entered by a user, the control parameters including a number of samples overlapped between adjacent data blocks; and
 instructions for processing the input data of each block designated by the pointer to produce output data,
 wherein the input and output data share memory space.

* * * * *

UNITED STATES PATENT AND TRADEMARK OFFICE
CERTIFICATE OF CORRECTION

PATENT NO. : 7,353,146 B2  Page 1 of 1
APPLICATION NO. : 10/744654
DATED : April 1, 2008
INVENTOR(S) : Zarrinkoub et al.

It is certified that error appears in the above-identified patent and that said Letters Patent is hereby corrected as shown below:

In the specification, in the summary of the invention section, at column 2, line number 32, in the printed patent, please change "blocks, for example," to --blocks; for example,--

In the specification, in the detailed description section, at column 10, line number 13, in the printed patent, please change "bock" to --block--

Signed and Sealed this

First Day of July, 2008

JON W. DUDAS
*Director of the United States Patent and Trademark Office*